United States Patent [19]

Cazaux et al.

[11] Patent Number: 5,777,672
[45] Date of Patent: Jul. 7, 1998

[54] PHOTOSENSITIVE DEVICE WITH JUXTAPOSED READING REGISTERS

[75] Inventors: Yvon Cazaux, Grenoble; Louis Brissot, Saint Egreve; Bruno Gili, Grenoble, all of France

[73] Assignee: Thomson Composants Militaires et Spatiaux, Courbevoie, France

[21] Appl. No.: 744,197

[22] Filed: Apr. 19, 1994

Related U.S. Application Data

[63] Continuation of Ser. No. 877,135, May 1, 1992, abandoned.

[30] Foreign Application Priority Data

May 3, 1991 [FR] France ............... 91 05470

[51] Int. Cl.$^6$ ............................................. H04N 5/335
[52] U.S. Cl. ............................................. 348/316
[58] Field of Search ............................ 348/302, 303, 348/304, 311, 315, 316, 317, 319, 320, 321, 322, 324; 257/240, 241

[56] References Cited

U.S. PATENT DOCUMENTS

| | | |
|---|---|---|
| 4,472,741 | 9/1984 | Takatsu et al. . |
| 4,611,234 | 9/1986 | Berger et al. . |
| 4,750,042 | 6/1988 | Murayama et al. ............ 348/323 |
| 4,819,067 | 4/1989 | Berger et al. . |
| 4,819,072 | 4/1989 | Boucharlat et al. . |
| 4,862,274 | 8/1989 | Cazaux . |
| 4,878,103 | 10/1989 | Cazaux et al. . |
| 4,949,183 | 8/1990 | Stevens . |
| 5,040,071 | 8/1991 | Stevens ............................. 348/319 |
| 5,055,931 | 10/1991 | Cazaux et al. . |
| 5,073,908 | 12/1991 | Cazaux . |

FOREIGN PATENT DOCUMENTS

| | | | |
|---|---|---|---|
| 62-160758 | 7/1987 | Japan | ............... H04N 5/335 |
| 63-9153 | 1/1988 | Japan | ............... H04N 5/335 |
| 3-171771 | 7/1991 | Japan | ............... H04N 5/335 |

OTHER PUBLICATIONS

Photocapteur Matriciel à transfert de Charges pour Caméras de studio TVHD-D. Herault (L'Onde Électrique-Mai-Juin 1990-vol. 70 No. 3/51).

Primary Examiner—Andrew I. Faile
Assistant Examiner—Tuan V. Ho
Attorney, Agent, or Firm—Oblon, Spivak, McClelland, Maier & Neustadt, P.C.

[57] ABSTRACT

In a CCD type photosensitive device, the charges produced in two consecutive columns of pixels are transferred into different reading registers: the charges from the first column are loaded into the first register and the charges from the second column travel through the first register to be loaded into the second register. The two reading registers are controlled by independent potentials during the step for the loading of these registers. The device makes it possible to increase the efficiency of the transfer between the two reading registers, especially when the registers are of the type working in a two-phase mode.

11 Claims, 6 Drawing Sheets

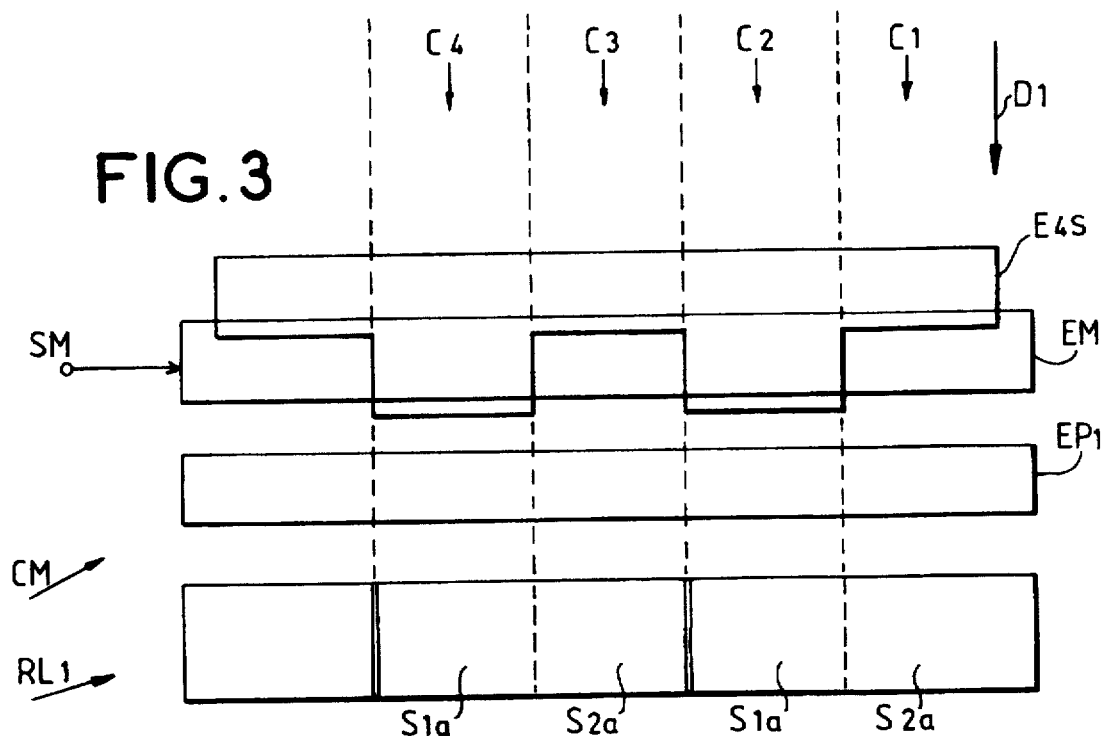
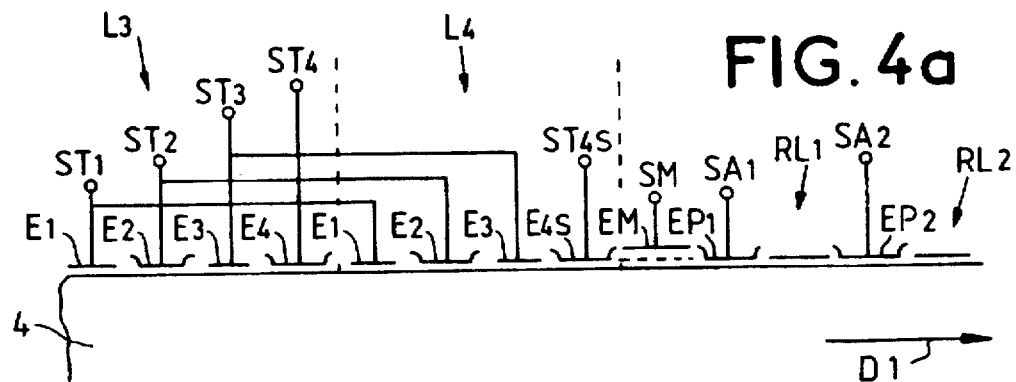
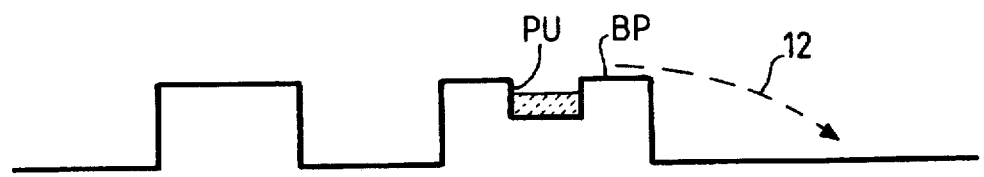

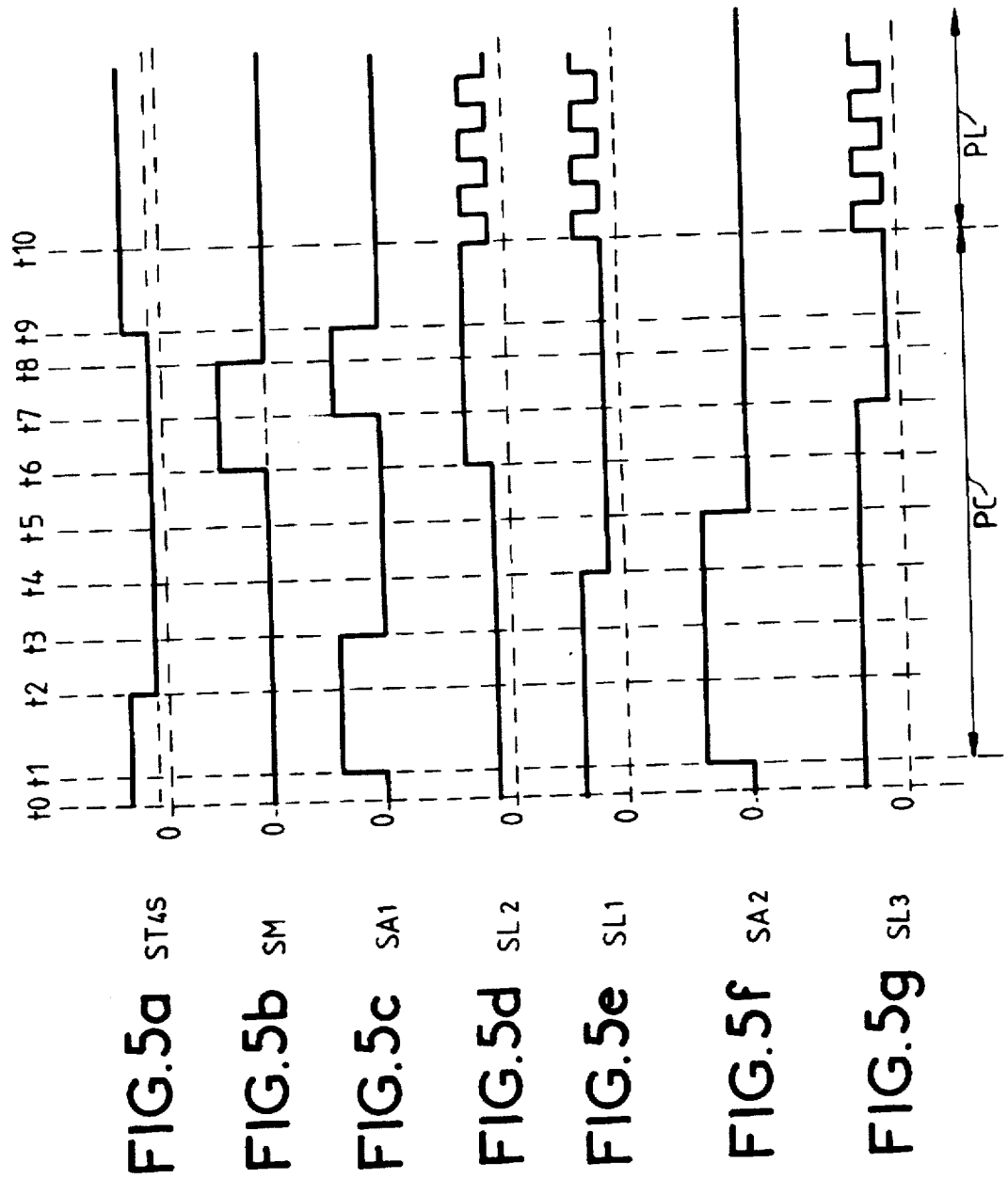

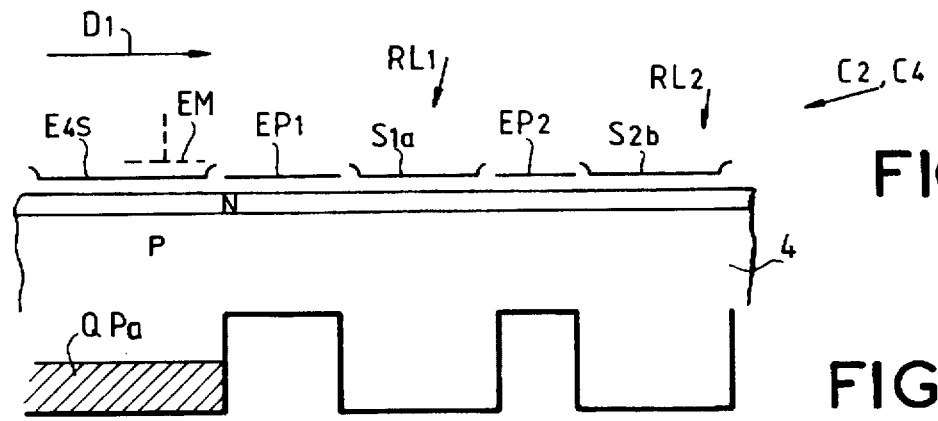
FIG. 6
FIG. 6a
FIG. 6b
FIG. 6c
FIG. 6d
FIG. 6e
FIG. 6f

PHOTOSENSITIVE DEVICE WITH JUXTAPOSED READING REGISTERS

This application is a continuation of application Ser. No. 07/877,135, filed on May 1, 1992, now abandoned.

BACKGROUND OF THE INVENTION

1. Field of the Invention

The invention relates to charge-coupled semiconductor devices, notably to devices used to make image sensors. It especially relates to cases where these devices comprise pixels arranged in rows at a small pitch.

2. Description of the Prior Art

FIG. 1 gives a schematic view of a standard architecture of a charge-coupled device (CCD) organized to constitute a surface image detector. These devices are generally made on a P type silicon substrate for example, on which an epitaxial layer of the same type is made to grow. Electrodes E1 to E4, insulated by a thin insulator layer, are deposited on the surface of the substrate. The illumination of the silicon in a photosensitive zone ZP generates charges by photoelectrical effect. The photosensitive zone ZP is divided into a plurality of elementary photosensitive zones or pixels P1 to P16.

These pixels P1 to P16 are arranged in rows and columns. In the example of FIG. 1, and to simplify this drawing, only four rows L1 to L4 and only four columns C1 to C4 are shown but, naturally, the image detector may have a larger number of rows and columns or even a smaller number of them.

In the direction going from the column C1 to to the column C4, the sequences of pixels constitute CCD shift registers, each stage of which is constituted by a pixel P1 to P16. Hereinafter in the description, these registers are called "column registers RC1 to RC4". Each column register thus enables the transfer, in a transfer direction Dl, of the charges produced in the corresponding column C1 to C4. To this end, the electrodes E1 to E4 of all the pixels P1 to P16 are controlled by a succession of potentials capable of prompting an alternation, beneath these electrodes, of potential wells and potential barriers suited to the production of the transfer. This is obtained by the application, to the electrodes E1 to E4, of the transfer signals constituted by voltage square-wave pulses, ST1 to ST4, having different phases.

The charges may be transferred in a two-phase mode, or in three, four or more phases. In the example shown, this transfer is done in the four-phase mode. To this effect, each stage or pixel P1 to P16 is divided into four sub-stages, i.e. each stage has four electrodes E1, E2, E3, E4 which succeed one another in the direction going from the column C1 to the column C4, each of said four electrodes receiving a transfer signal that has a phase different from the phase of the signal received by the other electrodes of the same stage. Thus, in the three-phase mode, each stage or pixel P1 to P16 has three electrodes, each receiving a different transfer signal. And in the two-phase mode, each stage comprises two pairs of electrodes, the two electrodes of a same pair being connected and controlled by a single transfer signal.

The charges produced in each pixel or stage P1 to P16 should be conveyed up to a reading circuit CL1, CL2, one output O1, O2 of which delivers a voltage signal proportional to the value of the charge read. To this end, the charges are transferred initially in the transfer direction D1 parallel to the columns C1 to C4; then the charges are transferred a second time in a second transfer direction D2 perpendicular to the first direction, by means of one or more CCD shift registers called reading registers RL1, RL2.

The pixels P1 to P16 of a row L1 to L4 are arranged at a pitch p1 which may vary according to need (as a function notably of the image definition to be obtained). When the pitch p1 (which constitutes the pitch of the columns C1 to C4) becomes small, for example smaller than 12 micrometers, it gets very difficult to carry out the transfer in the second transfer direction D2 by means of a single reading register, because the space needed to make a stage of a reading register RL1, RL2 is greater than the pitch p1 of the pixels P1 to P16.

Indeed, the structure of a stage of a reading register is substantially the same as that of a pixel P1 to P16 or stage of a column register RC1 to RC4: because, it is necessary to position several electrodes successively in each stage, in the transfer direction envisaged, i.e. here in the second direction D2. It is then impossible to make each column register RC1 to RC4 end in a stage of a single reading register having as many stages (arranged according to the pitch p1) as there are column registers.

The standard solution to this problem is shown in FIG. 1. It consists, firstly, in using two juxtaposed reading registers RL1, RL2, having reading stages A1, A2 and B1, B2 respectively and, secondly, in arranging these stages according to a pitch p3 which is twice the first pitch p1.

The two reading registers RL1, RL2 are parallel and extend perpendicularly to the column registers RC1 to RC4 with respect to which they are positioned on a same side.

A first electrode and a second electrode, called "passage electrodes" EP1, EP2, extend in parallel to the two reading registers RL1, RL2. Their function is to enable or to prohibit the passage of charges in the first transfer direction D1, under the control of enabling signals SA1, SA2. The first passage electrode EP1 is positioned in the image zone ZP and the reading registers RL1, RL2. The second passage electrode EP2 is positioned between these two reading registers.

The charges produced in two adjacent, i.e. consecutive columns C1 to C4 are transferred to be loaded into reading stages belonging to different reading registers. Thus, in the example shown: the charges contained in the second and fourth columns C2, C4 (columns which are not next to each other) are loaded respectively into the first and second reading stages B1, B2 of the second reading register RL2 (the most distant of the two reading registers); the charges of the first and third columns C1, C3 are loaded respectively into the first and second stages A1, A2 of the first reading register RL1 (the closest register).

In the example shown in FIG. 1, the reading registers RL1, RL2 work in the two-phase mode. Consequently, each of their stages is formed by a first sub-stage and a second sub-stage Se1, Se2 positioned in succession along the second transfer direction D2, each sub-stage comprising a pair Pe1, Pe2 of electrodes electrically connected to each other. The two sub-stages Se1, Se2 of a same reading stage are respectively controlled by transfer signals SL1, SL2 having different phases (i.e. phases that are complementary during the reading period in the case of a two-phase operation), these transfer signals SL1, SL2 being applied to all the sub-stages Se1, Se2 to achieve the transfer towards the reading circuits CL1, CL2 after loading in the reading stages.

To be loaded into the stages B1, B2 of the second reading register RL2, the charges coming from the second and fourth columns C2, C4 go through the first reading register RL1. More specifically, in the example shown, they are first of all transferred into the first sub-stages Se1 of the first reading register RL1, from where they are then transferred into the first sub-stages Se1 of the second reading register RL2.

At the same time as the charges from the columns C2, C4 are transferred, the charges coming from the first and third columns C1, C3 are loaded into the second sub-stages Se2 of the first reading register RL1. To prevent the passage of the latter charges towards the second reading register RL2, it is common practice to make an insulation barrier Bi between the two second sub-stages Se2 facing each other and belonging to different reading registers RL1, RL2. This insulation may be provided under the second passage electrode EP2 for example, either in the form of a thick oxide or in the form of an appropriately doped zone.

This approach to juxtaposed reading registers is extensively used at present. However, it has drawbacks such as technological complexity and/or complexity of implementation. This complexity entails notably certain difficulties in making an efficient transfer between the reading registers, resulting inter alia in a loss of row resolution.

Thus, for example, with the assembly shown in FIG. 1, it is necessary to make two so-called "buried channel" implantations with different doping levels, with very high precision in the doping difference to carry out the transfer between the two reading registers: a first N doped buried channel (not shown) provides for the passage of the charges (along the first transfer direction D1) upline from the second passage electrode, and a second N+ doped buried channel (not shown) provides for the passage of the charges downline from the second passage electrode EP2 up to the second reading register RL2, the junction between these two channels taking place substantially in the middle of the second gate electrode EP2. The electrical field generated by these different doping levels achieves the transfer. In a configuration of this kind, the electrical field set up may be insufficient to make a complete transfer, towards the second reading register, of the charges that have passed through a first sub-stage of the first reading register. The result thereof may be that, during the transfer made in the second transfer direction D2, residual charges get added to those transferred towards the first reading circuit CL1, resulting in a deterioration of the resolution of the image sensor. Another drawback of this configuration is that it makes it necessary to increase the value of the voltages applied to the reading circuits.

We may also cite another structure wherein the passage of the charges from one reading register to another is achieved by means of a momentary storage beneath the passage electrode EP2. The drawback of this other structure is that it makes it necessary to provide for a potential well capable of storing all the charges, in a zone that is known to raise difficulties, thus giving rise to the need for very high-precision manufacturing.

All these drawbacks are especially pronounced when the reading registers are of the type working in the two-phase mode but there are cases where the use of such reading registers is necessary: for example, when the charges have to be transferred at very high speeds towards one or more reading circuits, it is necessary to work in the two-phase mode rather than in the three-phase, four-phase or n-phase modes.

SUMMARY OF THE INVENTION

The present invention relates to a photosensitive device with juxtaposed reading registers that does not have the above-mentioned drawbacks.

The expression "juxtaposed reading registers" refers herein to an assembly of the above-described type wherein, firstly, at least two reading registers are on the same side with respect to the columns, one of the registers being closer to the columns than the other one, the stages that constitute these registers being positioned according to a pitch p3 that corresponds to the pitch p1 of the pixel columns multiplied by the number of registers; and wherein, secondly, the charges of two consecutive columns are loaded into different reading registers, the charges transferred into the most distant register passing through a sub-stage of the closest register.

According to the invention, there is proposed a photosensitive charge-coupled device, comprising a matrix arrangement of elementary photosensitive zones or pixels, at least two distinct reading registers, the photosensitive charges coming from certain columns being loaded into the first register while the charges coming from other columns go through the first register to be loaded into the second register, wherein, during the step for the loading of the reading registers, said reading registers are controlled at least partially by independent potentials.

This enables the setting up, during the loading of the reading registers, of a relatively substantial difference in potential between the sub-stages of the first reading register and the second reading register, and thus enables the generation of electrical fields that are far more favorable to the transfer of the charges.

BRIEF DESCRIPTION OF THE DRAWINGS

The characteristics and advantages of the invention shall appear more clearly from the following description, given by way of a non-restrictive example and made with reference to the appended drawings, of which:

FIG. 3 shows the form of a final electrode of of a photosensitive zone shown in FIG. 2;

FIG. 4a is a sectional view showing electrodes shown in FIG. 3;

FIG. 4b shows the potentials generated beneath the electrodes of FIG. 4;

FIGS. 5a to 5b constitute a timing diagram of signals applied to the electrodes shown in FIG. 4;

FIGS. 6 to 6f illustrate potentials generated, during operation, in an even-order column;

DETAILED DESCRIPTION OF THE INVENTION

Figure 2:
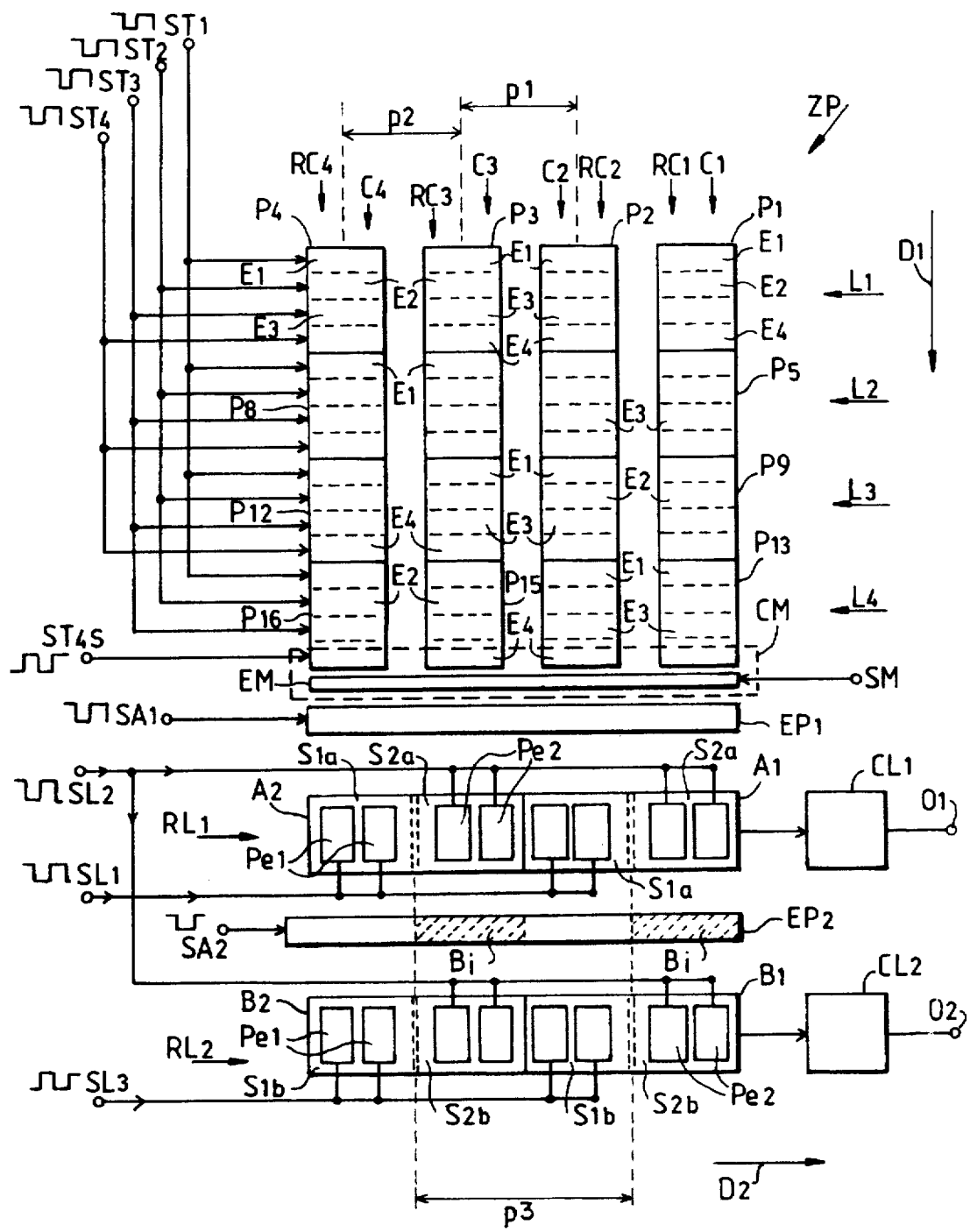
FIG. 2 shows a schematic view of a CCD according to the invention.

FIG. 2 shows a schematic view of a photosensitive charge-coupled device (CCD) 2 according to the invention. The photosensitive device 2 has a photosensitive zone ZP formed by a plurality of elementary photosensitive zones or pixels P1 to P16.

Figure 1:
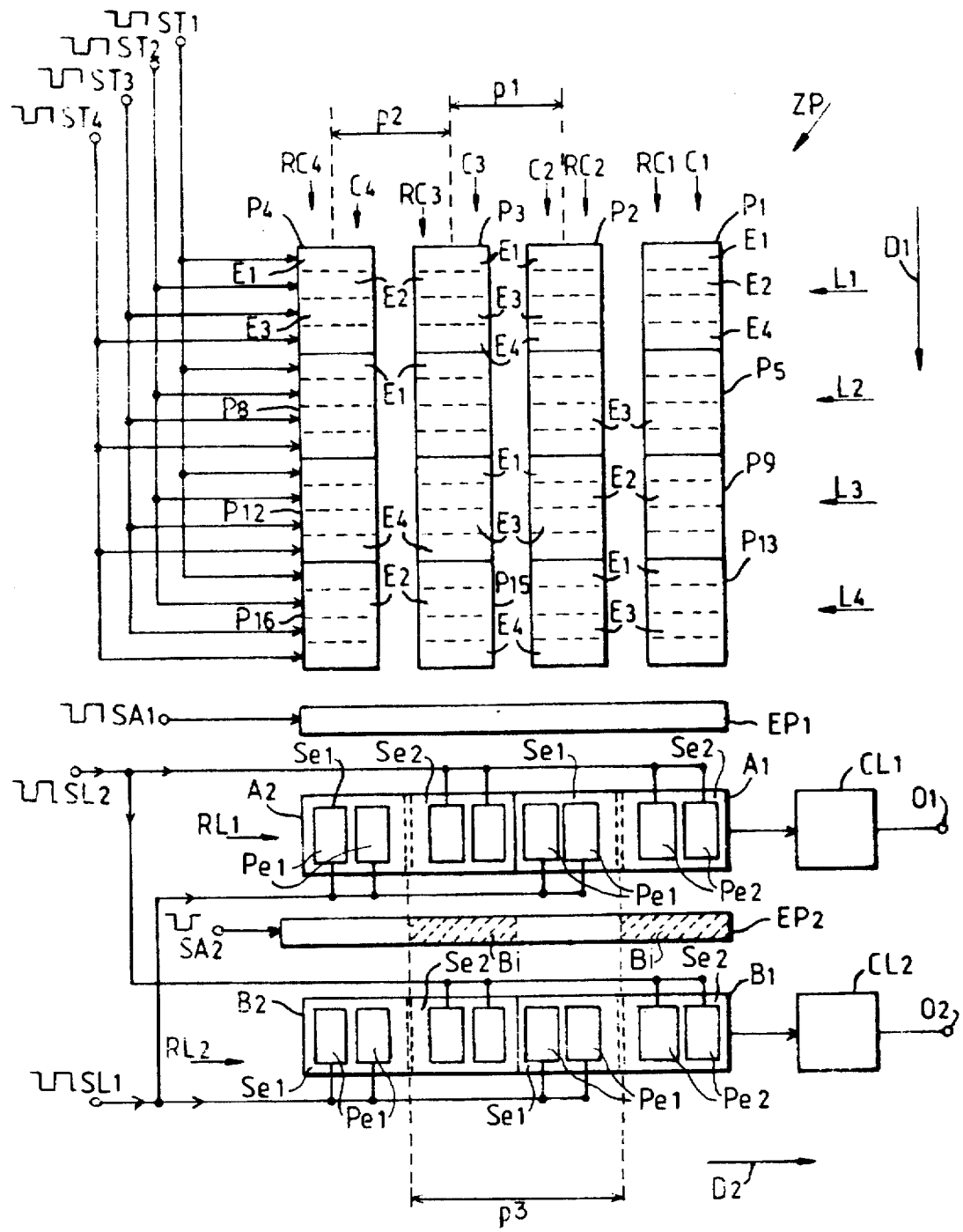
FIG. 1, already described, shows the general organization of a photosensitive CCD of the invention.

The photosensitive device 2 is of a type similar to the one shown in FIG. 1, in that it comprises reading registers RL1, RL2 that are juxtaposed in order to transfer charges, produced by the pixels P1 to P16, up to the reading circuits CL1, CL2.

The pixels P1 to P16 are arranged in N rows and M columns with, firstly, a number M of columns equal to or greater than 2 and, secondly, a number N of rows equal to or greater than 1 (the photosensitive device 1 may possibly constitute a linear array having only one row). In the non-restrictive example described, to simplify FIG. 2, only four rows L1 to L4 and four columns C1 to C4 are shown, formed by means of sixteen pixels P1 to P16.

In the direction going from the row L1 to the row L4, the pixels P1 to P16 are positioned according to a pitch p1 which constitutes the pitch according to which the columns C1 to C4 are arranged.

In the direction going from the column C1 to the column C4, the sequences of pixels P1 to P16 in each of these columns C1 to C4 constitute a shift register (called a column register RC1 to RC4), each stage of which is formed by a pixel.

The charges produced in the columns C1 to C4 are transferred by means of these column registers, in a first transfer direction D1 up to the reading registers RL1, RL2.

The shift registers RL1, RL2 are positioned on the side corresponding to an end of the columns C1 to C4 and are perpendicular to these columns C1 to C4. They comprise reading stages, A1, A2 and B1, B2 respectively and, in each of these registers, these stages are positioned according to a pitch p3 equal to the pitch p1 multiplied by the number of reading registers; in the example p3=p1×2.

The first reading register RL1 positioned as closely as possible to the photosensitive zone ZP is separated from the latter by a first passage electrode EP1, controlled by an enabling signal SA1. A second passage electrode EP2 controlled by a second enabling signal SA2 is positioned between the two reading registers RL1, RL2.

The transfer in the column registers RC1 to RC4 can be done in the two-phase, three-phase or four-phase mode, or in modes using more phases. In the non-restrictive example shown, it is done according to the four-phase mode. To this effect, each pixel P1 to P16 has four electrodes or sub-stages E1, E2, E3, E4 which succeed one another in the first transfer direction D1. These electrodes E1 to E4 are controlled by transfer signals ST1 to ST4 having different phases.

As in the example of FIG. 1, the charges produced in consecutive columns C1 to C4 are transferred to different reading registers.

In the example shown, the charges produced in the first and third columns C1 and C3 are designed to be loaded respectively into the stages A1 and A2 of the first reading register RL1, and the charges produced in the second and fourth column C2 and C4 are designed to be loaded into the stages B1 and B2 of the second reading register RL2 which is the most distant one.

The reading registers RL1, RL2 are of the type working in the two-phase mode: consequently, each of their stages comprises pairs of electrodes PE1, PE2 with which two sub-stages per stage are formed: namely a first sub-stage and a second sub-stage S1a, S2a in each of the stages of the first register RL1, and a first sub-stage and a second sub-stage S1b, S2b for the stages of the second reading register RL2; these sub-stages succeed one another in the second transfer direction D2.

According to one characteristic of the invention, a multiplexing circuit CM is positioned between the photosensitive zone ZP and the reading registers RL1, RL2 so as to, initially, permit the passage, towards said reading registers, of only the charges designed to be transferred into the second register RL2 (the most distant one), in blocking the charges designed to be loaded into the first reading register RL1, and then, secondly, so as to load the first register RL1.

In the non-restrictive example shown, the multiplexer circuit CM has a multiplexing electrode EM controlled by a multiplexing signal SM. The multiplexing electrode extends in parallel to the reading registers RL1, RL2 between the first passage electrode EP1 and the fourth row L4 of pixels which is the row closest to this passage electrode. More specifically, the multiplexing electrode EM partially overlaps the last electrodes E4 (i.e. last when considered in the direction D1). In the example, these electrodes E4 constitute the fourth sub-stage of the pixels P13, P14, P15 and P16.

During the transfer of the charges into the column registers RC1 to RC4 done under the control of the transfer signals ST1 to ST4, in order to achieve the loading of the reading registers RL1, RL2, the multiplexing circuit CM sends, first of all, for example the charges produced in all the even-order columns (the columns C2 and C4 in the example) towards a first sub-stage S1a of the first reading register RL1 and then, from this first reading register RL1, these charges go towards a first (facing) sub-stage S1b of the second reading register RL2, while the charges of the odd-order columns C1 and C3 are maintained in the multiplexing circuit CM.

The electrodes that form the first sub-stages S1b of the second reading register are electrically insulated, i.e. independent of the electrodes that form the first sub-stages S1a of the first register RL1, unlike in the prior art where these electrodes are connected and always receive identical signals.

It must be noted that, in this step for the loading of the reading registers, the first control signal SL1 is set at the low level while the third control signal SL3 is at the high level, there is a substantial electrical field between the two reading registers RL1, RL2, i.e. between the two first facing sub-stages S1a, S1b of these two registers, this substantial electrical field facilitating an efficient transfer of the charges.

It should be further noted that, with the second control signal SL2 being at the low level, the passage of the charges between the stages of a same reading register is not possible in this transfer step carried out in the first direction D1.

Then, after the second reading register RL2 has received the charges of the even-order columns C2, C4, the charges contained in the multiplexing circuit CM and coming from the odd-order columns C1 and C3, are transferred and loaded into the second sub-stages S2a of the first reading register RL1.

With the two reading registers RL1, RL2 being loaded, the transfer of charges in the second direction D2 (to convey the charges up to the reading circuits CL1, CL2) can then start. During this transfer towards the reading circuits, all the first sub-stages S1a, S1b are controlled in a standard way, i.e. the signals SL1 and SL3 have a same phase and are complementary to the second control signal SL2 applied to all the second sub-stages S2a, S2b.

Thus, the operation of the reading registers RL1, RL2 is done in a standard way in the reading step proper which is carried out in the second transfer direction D2. It is only in the step for the loading of the reading registers RL1, RL2 that the third control signal SL3 replaces the first signal SL1 to control the first sub-stages S1b of the seond reading register RL2.

It must be noted that, before the starting of the reading step proper, namely the transfer of the charges towards the reading circuits, it is necessary to complete the loading step so that, in the two reading registers RL1, RL2, the charges are of a same rank, i.e. are in the same sub-stages, so as to eliminate a difference in position between the charges contained in a reading register and those contained in the other register. To this effect, the second reading register RL2 is controlled so that the charges contained in the first sub-stages S1b of the second register RL2 are transferred to a second sub-stage S2b of this second reading register RL2.

The electrical independence between the electrodes of the first sub-stages S1a belonging to the first reading register RL1 and the electrodes of the first sub-stages S1b belonging to the second reading register RL2 increases the efficiency of the transfer of the charges between these two registers, independently of the effects that result from the use of the multiplexing electrode EM. It is also possible not to use the multiplexing electrode, i.e. not to block the charges coming from certain columns if all the electrodes of a stage A1, A2, B1, B2 of the two reading registers RL1, RL2 are made independent of each other so as to control these electrodes by independent potentials during the step for the loading of these reading registers.

FIG. 3 is a top view similar to that of FIG. 2 and shows a non-restrictive example of a possible embodiment of the multiplexing circuit CM.

It must be noted that the operation carried out in the columns C1 to C4 to achieve the transfer in the direction D1 is modified starting from the last sub-stage of the of the photosensitive zone ZP, i.e. the fourth sub-stage (in the example shown) which is formed by the last electrode E4 which is closest to the multiplexing electrode EM and is called the final electrode E4S in the rest of the description.

The electrodes that define the different sub-stages E1 to E4 of a pixel P1 to P16 are commonly constituted by means of a same conductive electrode for all the sub-stages of a same row L1 to L4. An arrangement such as this is shown in FIG. 3 for the fourth and last electrode or final electrode E4S.

The final electrode E4S cooperates with the multiplexing electrode to which there is applied a multiplexing signal SM that may have a high level (positive in the example) and a low level (for example at 0V, i.e. at the potential of the semiconductor substrate that bears the different electrodes).

When the multiplexing signal SM is at the low level, it creates a potential beneath the multiplexing electrode EM (in the odd-order columns C1, C3) such that the charges stored beneath the final electrode E4S are blocked beneath this electrode and are not transferred in the first transfer direction D1.

According to the operation described further above, the blocking of these charges should take place solely for the charges contained in the odd-order columns C1, C3.

To this effect, the multiplexing electrode is made above the final electrode E4S (from which it is separated by an insulator layer in a manner that is standard per se), and the final electrode has notches cut into it so as to be interposed between the substrate and the multiplexing electrode EM above an even-order column C2, C4 and so that it is not interposed in this way in the case of an odd-order column.

An arrangement such as this is illustrated also by FIG. 4 which is a sectional view along a column C1 to C4.

FIG. 4 shows a schematic view, in the first transfer direction D1, of the succession of electrodes E1, E2, E3, E4 made on a substrate 4 and forming the sub-stages of the pixels belonging to the rows L3, L4. These sub-stages are followed by the multiplexing electrode EM, the first passage electrode EP1, the first reading register RL1, the second passage electrode EP2 and the second reading register RL2.

The sub-stages or electrodes E1, E2, E3, E4 receive transfer signals, ST1, ST2, ST3, ST4 respectively, that are identical for all the rows, except for the fourth electrode E4S which forms the final electrode.

The final electrode E4S indeed receives a transfer signal ST4S which is a particular signal in that, as compared with other transfer signals, its low level should have a value greater than that of the low levels of the other transfer signals. For example if, for the other transfer signals, the value of their low level is 0 volts (the potential of the substrate for example) and if the value of the high level is +10 volts, then the value of the high level of the transfer signal ST4S may be identical but the value of its low level should be three volts for example, in order to let a potential well remain, said potential well providing for the storage of the charges when the multiplexing signal SM applied to the multiplexing electrode EM is at the low level.

FIG. 4 shows the final electrode E4S extended by dotted lines beneath the multiplexing electrode EM. It should be taken to be the case that, when FIG. 4 represents an odd-order column C1 or C3, the final electrode E4S does not extend beneath the multiplexing electrode EM, which means that this electrode is active. On the contrary, for the even-order column C2, C4, the final electrode E4S extends beneath the multiplexing electrode EM which, in this case, exerts no effect irrespectively of the level of the signal SM that is applied to it.

In this configuration, when the multiplexing signal SM is applied with a low level (0 volts or close to 0 volts), it determines a potential, beneath the multiplexing electrode EM, that constitutes a potential barrier, but does so only in the odd-order columns C1, C3 as shown in FIG. 4b.

FIG. 4b shows the potentials generated in the substrate 4, beneath the different electrodes shown in FIG. 4, except beneath the second passage electrode EP2 and the second reading register RL2. According to a conventional method of representation used for charge-coupled circuits, the positive potentials increase in the downward direction in the figure.

In the example shown in FIG. 4b, the transfer signals ST1 and ST2 are at the high level. The transfer signals ST3, ST4, ST4S are at the low level; the multiplexing signal SM is at the low level: the first passage enabling signal SA1 is at the high level. Under these conditions, assuming that charges have been stored beneath the final electrode E4S at an instant preceding the one shown in FIG. 4b, these charges remain blocked beneath this output electrode when the column is an odd-order column C1 to C3. This is due to the fact that, since the multiplexing electrode EM is active, it creates a low potential forming a potential barrier BP that counters the flowing away of the charges stored beneath the final electrode E4S. As explained further above, for this to happen, the low level of the signal ST4S should be positive in relation to the signals ST3 and SM so that, even at the low level of the signal ST4S, there is formed a potential well PU capable of containing all the charges that were already stored beneath beneath the final electrode E4S when the transfer signal ST4S was in the high state. This may be obtained by also bringing the surface area of the output electrode E4S into play.

In the case of an even-order column C2, C4, the multiplexing electrode EM is inoperative. It is the final electrode E4S that sets up its potential, in such a way that it is not constituted by potential barriers such as BP and so that the charges are shed towards the reading register RL1 as symbolized by an arrow 12 in FIG. 4b.

Naturally, the multiplexing circuit may be made differently, and other operations are possible. What is important is that the charges coming from one column should be held while, at the same time, the charges coming from a neighboring column should be let through.

It may be recalled that, according to one of the standard types of operation of a CCD image sensor, an operation cycle comprises a charge accumulation step followed by N times a step for the loading of the reading registers plus a reading step and then, again, an accumulation step etc. Here N is equal to the number of rows such as the rows L1 to L4. The loading step is carried in the first transfer direction D1. Each time, it includes a transfer from one stage to the columns C1 to C4 as well as the loading, into the stages of the reading registers, of the charges already stored beneath the final electrodes E4S. The reading step is then carried out and consists of a transfer done in the second direction D2. During this transfer, all the charges contained in a reading register RL1, RL2 are conveyed towards a reading circuit and read by this circuit.

FIGS. 5a to 5g constitute a timing diagram of the different signals applied, during a step for the loading of the two reading registers RL1, RL2, to the different electrodes which, in the columns C1 to C4, succeed one another in the first transfer direction D1, from the final electrode E4S to the second reading register RL2.

The different signals shown may vary between a low level that is close to or corresponds to the potential of the substrate (i.e. the 0 volts level for example) and a high level that is positive or negative depending on the doping of the substrate. Assuming, for example, that the substrate has P type doping, the high level is positive.

FIG. 5a shows the transfer signal ST4S applied to the final electrodes E4S. This signal may vary between a high level having a same value as the other signals and a low level which, for its part, is more positive than the levels of the other signals as indicated here above.

FIG. 5b shows the multiplexing signal SM applied to the multiplexing electrode EM.

FIG. 5c shows the first enabling signal SA1 applied to the first passage electrode EP1.

FIG. 5d shows the second control signal SL2 applied to the second sub-stages Sa2, Sb2 of the reading registers RL1, RL2. For improved efficiency of operation in the loading step, the value of the low level of this control signal SL2 is more positive than zero volts with, for example, a value equal to that of the low level of the transfer signal ST4S.

FIG. 5e shows the first control signal SL1 applied to the first sub-stages Sa1 of the first reading register RL1. Preferably (but this is not obligatory) the value of the low level of this first control signal SL1 is the same as that of the second control signal SL2.

FIG. 5f shows the second enabling signal SA2 applied to the second passage electrode EP2.

FIG. 5g shows the third control signal SL3 applied to the first sub-stages S1b of the second reading register RL2. This third signal SL3 too has a low level, the value of which is preferably more positive than 0 volts, like the first and second control signal SL1, SL2.

At an instant t0 that precedes the loading period:
- the transfer signal SL4S (FIG. 5a) is at the high level;
- the multiplexing signal SM (FIG. 5b) is at the low level;
- the first enabling signal SA1 (FIG. 5c) is at the low level;
- the second control signal SL2 (FIG. 5d) is at the low level;
- the first control signal SL1 (FIG. 5e) is at the high level;
- the second enabling signal SA2 (FIG. 5f) is at the low level;
- the third control signal SL3 (FIG. 5g) is at the high level;

At a period t1 that follows t0 and marks the start of the loading period PC:
- the first enabling signal SA1 goes to the high level;
- the second enabling signal SA2 goes to the low level.

At an instant t2 which follows t1, the transfer signal ST45 applied to the final electrode E4S goes to the low level. This marks the start of the transfer of the charges of an even-order column towards the reading register RL2.

At an instant t3 which follows t2: the first enabling signal SA1 goes to the low level.

At an instant t4 which follows t3: the first control signal SL1 goes to the low level.

At an instant t5 which follows t4, the second enabling signal SA2 goes to the low level.

At an instant t6 which follows t5:
- the multiplexing signal SM goes to the high level;
- the second control signal SL2 goes to the high level.

At an instant t7 which follows t6:
- the first enabling signal SA1 goes to the high level: the result of this is the transfer of the charges from the odd-order columns towards the first reading register RL1;
- the third control signal SL3 goes to the low level: the result of this is a transfer, to the second reading register RL2, of the charges which go from a first sub-stage S1b to a second sub-stage S2b.

At an instant t8 which follows t7, the multiplexing signal SM goes to the low level.

At an instant t9 which follows t8:
- the transfer signal ST4S goes to the high level;
- the enabling signal SA1 goes to the low level, thus marking the end of the period for the loading of the reading registers.

At an instant t10 which follows t9:
the first and the third control signals SL1, SL3 go to the high level while the second control signal SL2 goes to the low level. This marks the start of the reading period PL, during which the two reading registers RL1, RL2 transfer the charges that they contain to the reading circuits.

These three control signals SL1, SL2, SL3 are each constituted by a succession of square-wave pulses having the same frequency. It is noted that the first and third control signals have a same phase which is complementary to that of the second control signal second control signal SL2. It is observed that, in this way, the facing sub-stages S1a, S1b and S2a, S2b belonging to different registers RL1 and RL2 are controlled with a same phase. This can be seen especially for the first sub-stages S1a and S1b which, during the loading period are, on the contrary controlled by signals of different phases.

FIGS. 6a to 6f illustrate the potentials generated in the substrate beneath the electrodes of an even-order column C2, C4 of the kind shown in a sectional view in FIG. 6. These potentials are those generated at the instants mentioned with reference to FIGS. 5a to 5g.

FIG. 6 shows a succession of electrodes of an even-order column C2, C4, starting from the final electrode and following the first transfer direction D1. This figure shows, successively: the final electrode E4S, the first passage electrode EP1, the electrodes forming a first sub-stage S1a of the first reading register, the second passage electrode EP2, the electrodes that form the first sub-stage S1b of the second reading register RL2. These electrodes are made on the substrate 4, above an N doped layer that constitutes a buried channel. Since the multiplexing electrode EM is not active in an even-order column C2 or C4, it is shown in dashes.

FIG. 6a pertains to the instant t0. It shows that, beneath the final electrode E4S, there is created a potential well capable of containing a quantity of charge QPa.

FIG. 6b pertains to the instant t1. It shows that the charges QPa are distributed beneath the electrodes E4S, EP1, S1a, EP2 and S1b.

FIG. 6c shows that, at the instant t2, the charges which were beneath E4S are shed beneath EP1, S1a, EP2 and S1b.

FIG. 6d shows that, at the instant t3, the charges which were contained beneath EP1 are shed beneath S1a, EP2 and S1b.

FIG. 6e shows that, at the instant t4, the charges QPa are contained solely in the first sub-stage S1b of the second register RL2 firstly because of the passing to the low level of the second control signal SL2 and, secondly, because in the example shown, the potential beneath EP2 is less positive than it is beneath S1b (the high level of the second enabling signal SA2 is, for example, less positive by two volts than, for example, the other signals). This is not indispensable but may prevent a backward return of the charges.

FIG. 6f shows that, at the instant t5, the potential EP2 has become negative, thus confirming the storage of the charges Qpa under S1b.

With the quantity of charges QPa created in an even-order column C2, C4 having been thus transferred into a first sub-stage S1b of the second reading register RL2 after having crossed the first reading register RL1, it is then transferred perpendicularly to the plane of the figure (in the second transfer direction D2) up to a second sub-stage S2b of the second reading register RL2.

Figure 7:
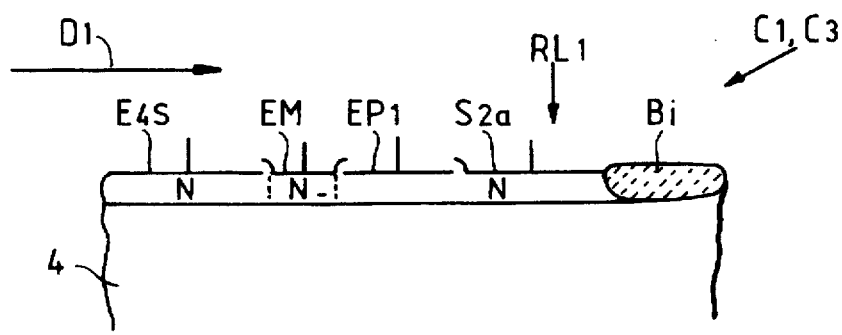
FIGS. 7 to 7g show potentials generated, during operation, in an odd-order column.

FIGS. 7a to 7j illustrate the potentials generated beneath the electrodes of an odd-order column C1, C3, of the kind shown partially by a sectional view in FIG. 7. These potentials are those generated at the instants mentioned with reference to FIGS. 5a to 5g.

FIG. 7 shows electrodes of an odd-order column C1, C3, which succeed one another along the first transfer direction D1, starting from a final electrode E4S. After the final electrode E4S there are, successively, the multiplexing electrode EM, the first passage electrode EP1, the electrodes forming a second sub-stage S2a of the first reading register RL1, then an insulator barrier Bi that prevents any transfer of charges beyond this second sub-stage S2a. These electrodes are made on the substrate 4 above an N doped layer forming a buried channel.

Figure 7A:

FIG. 7a pertains to the instant t0. It shows that, beneath the final electrode E4S, there is created a potential well containing a quantity of charges QPi collected in an odd-order column C1, C3. The potentials beneath the other electrodes are positive with respect to the potential created beneath E4S. It must be noted that, for more efficient operation, it is advantageous (but not obligatory) to make an N- doped zone in the N type buried channel, beneath the multiplexing electrode EM. This gives the potential beneath the electrode EM an even more negative value.

Figure 7B:

FIG. 7b shows that, at the instant t1, all the charges QPi remain stored beneath the final electrode E4S, although the potential has become positive beneath the passage electrode EP1.

Figure 7C:
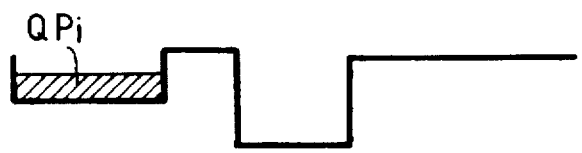

FIG. 7c shows that, at the instant t2, the charges QPi remain held beneath the final electrode E4S while, in the even-order column C2, C4, at this same instant, the charges QPa leave this electrode.

Figure 7D:

FIG. 7d shows that, at the instant t3, the potential beneath the passage electrode EP1 becomes negative, without any influence on the charges QPi which remain stored beneath E4S. This is maintained also for the instants t4 and t5.

Figure 7E:
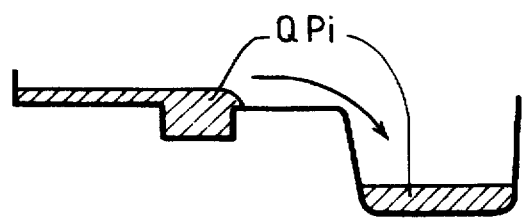

FIG. 7e shows that, at the instant t6, the potential becomes positive beneath the multiplexing electrode EM and beneath the electrodes which constitute the second sub-stage S2a of the first reading register RL1, in such a way that a part of the charges QPi is shed into the second sub-stage S2a.

Figure 7F:
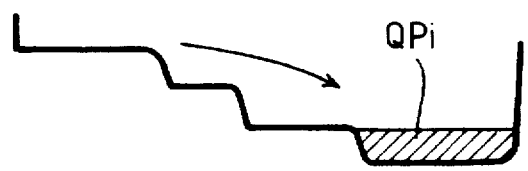

FIG. 7f shows that, at the instant t7, the potential beneath the first passage electrode EP1 becomes more positive: all the charges remaining beneath the final electrode E4S are then shed towards the second sub-stage S2a.

Figure 7G:

FIG. 7g shows that, at the instant t9, all the charges QPi are contained in the potential well formed by the second sub-stage S2a of the first reading register RL1.

What is claimed is:

1. A photosensitive charged-coupled device, comprising a matrix arrangement of elementary photsensitive zones or pixels, at least two distinct reading registers, wherein each stage of the reading registers comprises at least two sub-stages that succeed each other in a transfer direction perpendicular to the columns, each first and second sub-stages of the first reading register respectively facing a corresponding first and second sub-stages of the second reading register, wherein photosensitive charges coming from first columns are transferred in the second reading register through the first sub-stages of the first reading register during one loading operation of charges of a line of the matrix into the registers, while charges of second columns are transferred only into the first register during the same loading operation, said first and second columns alternating in the matrix along said transfer direction, each sub-stage having a respective control electrode and the control electrode of first sub-stage of the first reading register being electrically independent of the control electrode of corresponding first sub-stage of the second reading register, and wherein means are provided for applying different potentials respectively to the control electrodes of the first sub-stages of the first reading register and to the control electrodes of the first sub-stages of the second reading register durinng said loading operation.

2. A photosensitive device according to claim 1, further comprising transfer means for inhabiting the loading of said photosensitive charges from said certain columns into the first register while at the same time enabling the loading of said photosensitive charges from the other columns into the second register through the first register, and then loading the first register with said photosensitive charges from said certain columns.

3. A photosensitive device according to one of claims 1 and 2, wherein the reading registers are of the type working in a two-phase mode.

4. A photosensitive device according to one of claims 1 and 2, wherein the reading registers comprise stages arranged according to a pitch equal to N times the pitch of the columns, N being equal to the number of reading registers of the device.

5. A photosensitive device according to one of claims 1 and 2, each stage of the reading registers comprising at least two sub-stages that succeed each other in a transfer direction perpendicular to the columns, the first and second sub-stages of the first reading register respectively facing first and second sub-stages of the second reading register, the charges transferred into the second reading register going through first sub-stages of the first reading register, wherein electrodes that define the first sub-stages of the first reading register are electrically independent of electrodes that define the first sub-stages of the second register.

6. A photosensitive device according to claim 5 wherein, during loading of the reading registers, the first sub-stages of the first register are controlled by signals having a phase different from a phase of signals that control the first sub-stages of the second register.

7. A photosensitive device according to one claims 1 or 2, wherein all the electrodes of a stage of the reading registers are electrically independent in order to enable their control by independent potentials, during loading of the reading registers.

8. A photosensitive device according to claim 2, including two reading registers and wherein the multiplexing electrode retains the charges of one column of every two adjacent columns.

9. A photosensitive charge-coupled device, comprising a matrix arrangement of elementary photosensitive zones or pixels, at least two distinct reading registers, photosensitive charges coming from certain columns being loaded into the first register while the charges coming from other columns go through the first register to be loaded into the second register, wherein during loading of the reading registers, each stage of the reading registers comprises at least two sub-stages that succeed each other in a transfer direction perpendicular to the columns, the first and second sub-stages of the first reading register respectively face first and second sub-stages of the second reading register, the charges are transferred into the second reading register going through first sub-stages of the first reading register, and wherein means are provided for applying different potentials respectively to the first sub-stages of the first reading register and the first sub-stages of the second reading register during a loading operation, each pixel comprising at least two electrodes succeeding each other in a direction in which the columns are arranged and following a first transfer direction, in each column, the last electrode of the last pixel constituting an electrode called a final electrode, at least one passage electrode being positioned between the photosensitive zone and the reading registers in order to prohibit or enable charge transfer toward the reading registers, wherein at least one multiplexing electrode is positioned between the pixels and the passage electrode, the multiplexing electrode cooperating with the passage electrode and the output electrodes to retain the charges produced in at least one column on several consecutive columns.

10. A photosensitive device according to claim 9 said electrodes being formed on a semiconductor substrate, wherein the final electrodes are interposed between the multiplexing electrode and the substrate solely in the columns, the charges of which are not retained by means of the multiplexing electrode.

11. A photosensitive device according to claim 9 wherein, with the final electrodes being controlled by voltage signals that can vary between a high level and a low level, the value of the low level is such that it enables, in cooperation with the multiplexing electrode, a potential well to be formed beneath the final electrodes of the columns, the charges of which are retained.

* * * * *